United States Patent
Botula et al.

(10) Patent No.: US 8,288,821 B2
(45) Date of Patent: Oct. 16, 2012

(54) SOI (SILICON ON INSULATOR) SUBSTRATE IMPROVEMENTS

(75) Inventors: Alan Bernard Botula, Essex Junction, VT (US); David S. Collins, Williston, VT (US); Alvin Jose Joseph, Williston, VT (US); Howard Smith Landis, Underhill, VT (US); James Albert Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 12/547,526

(22) Filed: Aug. 26, 2009

(65) Prior Publication Data

US 2010/0230752 A1  Sep. 16, 2010

Related U.S. Application Data

(60) Provisional application No. 61/159,833, filed on Mar. 13, 2009.

(51) Int. Cl.
*H01L 29/786* (2006.01)
*H01L 21/336* (2006.01)

(52) U.S. Cl. ............ 257/347; 438/164; 257/E29.286; 257/E21.415

(58) Field of Classification Search .......... 438/183, 438/321, 926; 257/347, E29.286, E21.415, 257/E21.434, E21.444, E21.453
See application file for complete search history.

(56) References Cited

U.S. PATENT DOCUMENTS

| | | | |
|---|---|---|---|
| 7,192,839 B1 | 3/2007 | Ramkumar et al. | |
| 7,273,794 B2 | 9/2007 | Hakey et al. | |
| 2002/0043686 A1* | 4/2002 | Bolam et al. | 257/349 |
| 2003/0235959 A1 | 12/2003 | Lichtenberger et al. | |
| 2006/0228850 A1* | 10/2006 | Tsai et al. | 438/219 |
| 2007/0138561 A1* | 6/2007 | Hashimi et al. | 257/368 |
| 2008/0040696 A1 | 2/2008 | Hakey et al. | |

* cited by examiner

*Primary Examiner* — Matthew W Such
*Assistant Examiner* — Monica D Harrison
(74) *Attorney, Agent, or Firm* — Schmeiser, Olsen & Watts; Richard Korulak

(57) ABSTRACT

A structure, and a method for forming the same. The structure includes a semiconductor substrate which includes a top substrate surface, a buried dielectric layer on the top substrate surface, N active semiconductor regions on the buried dielectric layer, N active devices on the N active semiconductor regions, a plurality of dummy regions on the buried dielectric layer, a protection layer on the N active devices and the N active semiconductor regions, but not on the plurality of dummy regions. The N active devices comprise first active regions which comprise a first material. The plurality of dummy regions comprise first dummy regions which comprise the first material. A first pattern density of the first active regions and the first dummy regions is uniform across the structure. A trench in the buried dielectric layer such that side walls of the trench are aligned with the plurality of dummy regions.

20 Claims, 4 Drawing Sheets

US 8,288,821 B2

SOI (SILICON ON INSULATOR) SUBSTRATE IMPROVEMENTS

Applicant claims the benefit of Provisional Application, Ser. No. 61/159,833, SOI (Silicon on Insulator) Substrate Improvements, filed on Mar. 13, 2009.

FIELD OF THE INVENTION

The present invention relates generally to SOI (silicon on insulator) substrates and more particularly to SOI substrate improvements.

BACKGROUND OF THE INVENTION

The operation of an active device (e.g., a transistor) formed on a conventional SOI (silicon on insulator) substrate (including a buried oxide layer sandwiched between a top Si layer and a bottom Si layer) is usually affected detrimentally by the free mobile carriers near surface interface between the bottom Si layer and the buried oxide layer. Therefore, there is a need for structures (and methods for forming the same) in which the device operation is improved.

SUMMARY OF THE INVENTION

Methods of the present invention suppress free mobile carriers with the use of electrically neutral species implanted near the top surface of the bottom Si layer. Access for these implants is provided by trenches etched in the buried oxide in non-device areas. Trenches and device structures are mutually exclusive. Maximum effectiveness requires high trench density; but this is in conflict with the need to maintain uniform pattern density of active silicon and polysilicon features to permit wafer processing such as etching and chemical-mechanical polishing. Interleaving trench features and active or dummy device structures to achieve uniform density does not create an optimized structure because lithographic alignment tolerances require unused space between trenches and device or fill structures. In the present invention, the dummy structures are used as masks for creating the trenches, thereby avoiding the above drawbacks.

DETAILED DESCRIPTION OF THE INVENTION

Figure 1:
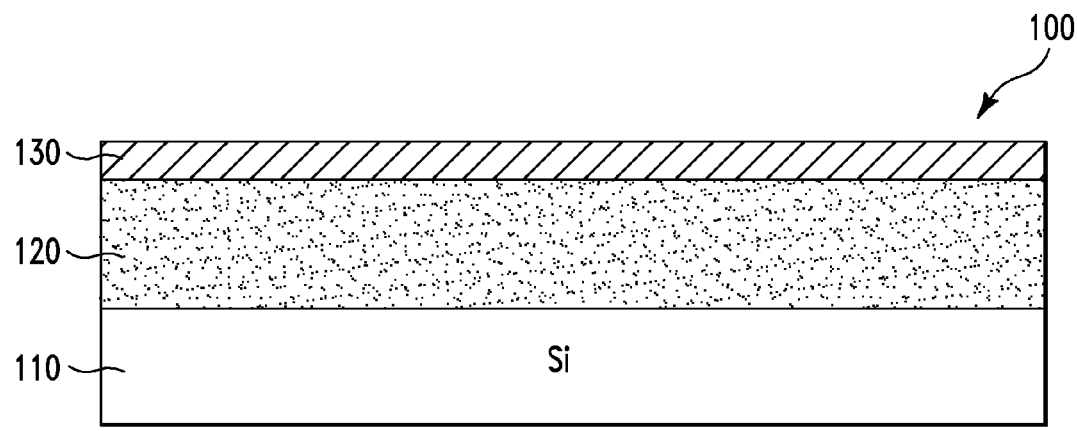
FIG. 1 shows an SOI (silicon on insulator) substrate, in accordance with embodiments of the present invention.

FIGS. 1-10 illustrate a fabrication process for forming a semiconductor structure 100 in accordance with embodiments of the present invention. More specifically, with reference to FIG. 1, the fabrication process can start with an SOI (silicon on insulator) substrate 110+120+130. In one embodiment, the SOI substrate 110+120+130 can comprise (i) a bottom semiconductor (e.g., silicon) layer/substrate 110, (ii) a buried dielectric (e.g., oxide) layer (BOX) layer 120 on the bottom silicon layer 110, and (iii) a top semiconductor (e.g., silicon) layer 130 on the BOX layer 120. The BOX layer 120 can comprise silicon dioxide (SiO2). The SOI substrate 110+120+130 can be formed using any conventional process.

Figure 2:
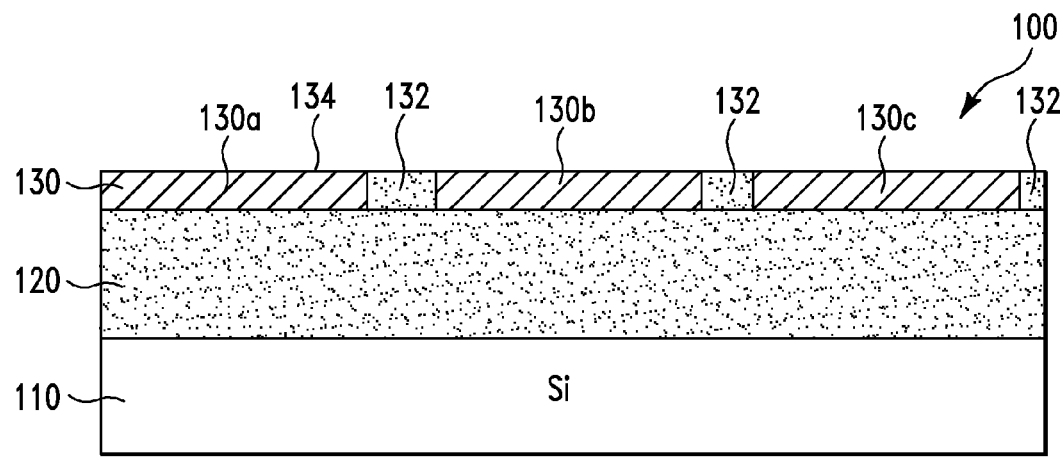
FIG. 2 shows an STI (shallow trench isolation) region formed in the structure of FIG. 1, in accordance with embodiments of the present invention.

Next, with reference to FIG. 2, in one embodiment, portions of the top silicon layer 130 are removed and replaced by a dielectric material such as silicon dioxide resulting in shallow trench isolation (STI) region 132. The (STI) region 132 can be formed by any conventional process. As a result of the formation of the STI region 132, the top silicon layer 130 is divided into active Si region 130a, and dummy Si regions 130b and 130c. In general, there can be any numbers of active and dummy Si regions. In one embodiment, the pattern density of all the active and dummy Si regions of the structure 100 (including the Si regions 130a, 130b, and 130c) is essentially uniform across the structure 100. In other words, the pattern density of all the active and dummy Si regions of the structure 100 remains essentially the same for any two different areas on the structure 100. In general, the pattern density of multiple regions for an area of the structure 100 is the percentage of that area which is occupied by the multiple regions. For example, if all the active and dummy Si regions of the structure 100 occupy 40 $\mu m^2$ of a 100 $\mu m^2$ area of the structure 100, then the density of all the active and dummy Si regions of the structure 100 in that 100 $\mu m^2$ area is 40%.

A region is called active if it is a part of an active device (such as transistor, capacitor, resistor, diode, etc.) of the complete semiconductor structure/circuit 100. A device is considered active if the device plays a role in the normal operation of the complete structure/circuit 100. As will be clear later, the Si region 130a is active because it is a part (i.e., body/channel region) of an active transistor of the complete semiconductor structure/circuit 100. It should be noted that a Si region does not have to be part of an active transistor of the complete semiconductor structure/circuit 100 to be active. For example, the Si region can also be an active Si region if the Si region is part of a non-transistor active device of the complete semiconductor structure/circuit 100 such as a p-n junction diode.

In contrast, a region is called dummy if it is not a part of any active device of the complete semiconductor structure 100. The purpose of a dummy region (like the Si regions 130b and 130c) is to provide a uniform pattern density across the semiconductor structure 100 so as to facilitate subsequent fabrication steps (such as chemical mechanical polishing—CMP).

Figure 3:
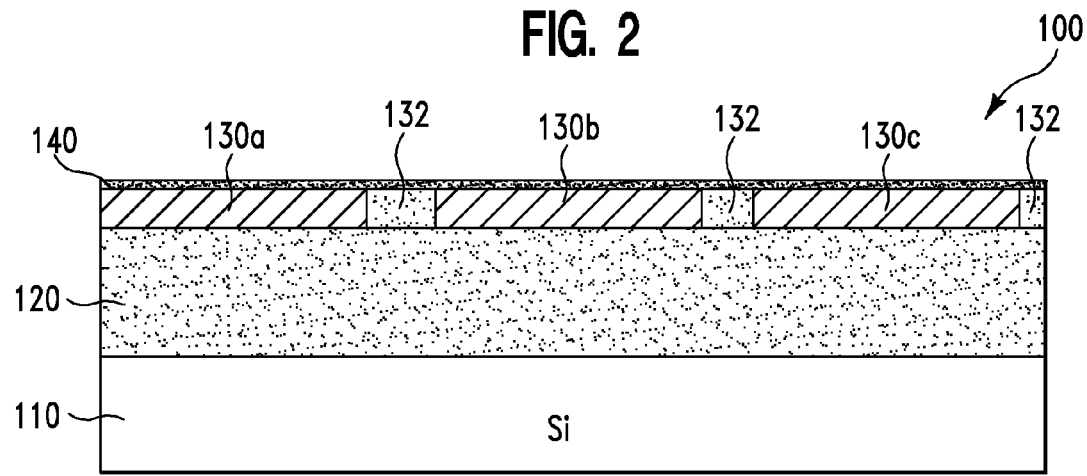
FIG. 3 shows a gate dielectric layer formed on the structure of FIG. 2, in accordance with embodiments of the present invention.

Next, with reference to FIG. 3, in one embodiment, a gate dielectric layer 140 is formed on top of the semiconductor structure 100 of FIG. 2. More specifically, the gate dielectric layer 140 can be formed by depositing a dielectric material (such as silicon dioxide—SiO2) on top of the semiconductor structure 100 of FIG. 2. If SiO2 is used, the gate dielectric layer 140 can be formed by CVD (chemical vapor deposition) of SiO2 on top of the semiconductor structure 100 of FIG. 2. Alternatively, the SiO2 gate dielectric layer 140 can be formed by thermal oxidation of a top silicon surface 134 (FIG. 2) of the top silicon layer 130.

Figure 4:
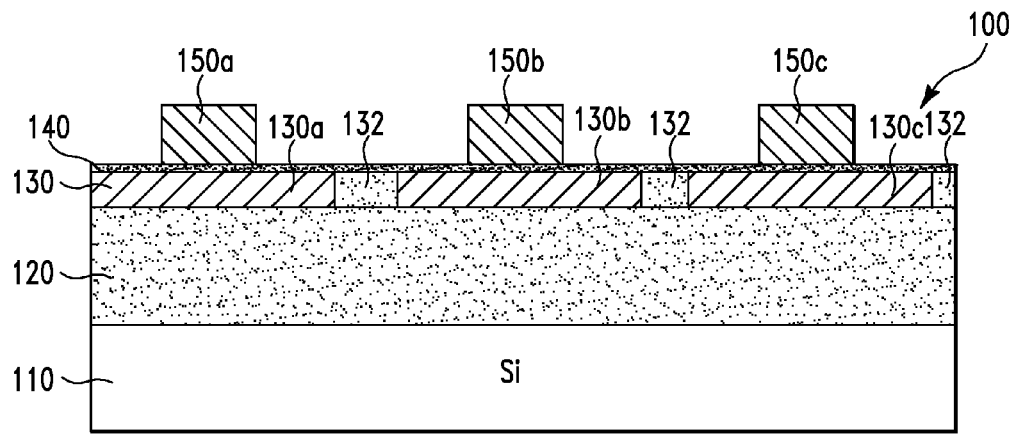
FIG. 4 shows gate electrode regions formed on the structure of FIG. 3, in accordance with embodiments of the present invention.

Next, with reference to FIG. 4, in one embodiment, active electrically conductive region 150a and dummy electrically conductive regions 150b and 150c are formed on the semiconductor structure 100 of FIG. 3. In one embodiment, the electrically conductive regions 150a, 150b, and 150c comprise an electrically conductive material such as polysilicon. The polysilicon regions 150a, 150b, and 150c can be simultaneously formed using conventional lithographic and etching processes. In general, there can be any numbers of active and dummy polysilicon regions (like the polysilicon regions 150a, 150b, and 150c). In one embodiment, the pattern density of all the active and dummy polysilicon regions of the structure 100 is essentially uniform across the structure 100. As will be clear later, the polysilicon region 150a is active because it is a part (i.e., a gate electrode region) of an active transistor of the complete semiconductor structure/circuit 100. It should be noted that a polysilicon region does not have to be part of an active transistor of the complete semiconductor structure/circuit 100 to be active. For example, the polysilicon region can also be an active polysilicon region if the polysilicon region is part of a non-transistor active device of the complete semiconductor structure/circuit 100 such as a polysilicon resistor. It should be also noted that in general, a dummy polysilicon region does not necessarily overlap a dummy Si region, although in FIG. 4, the polysilicon region 150b overlaps dummy Si region 130b, and the polysilicon region 150c overlaps dummy Si region 130c.

Figure 5:
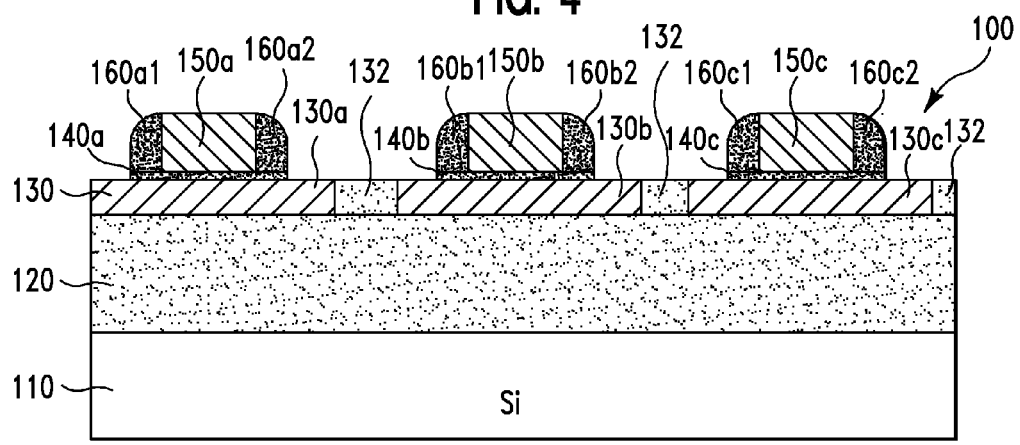
FIG. 5 shows gate dielectric spacers formed on side walls of the gate electrode regions of FIG. 4, in accordance with embodiments of the present invention.

Next, with reference to FIG. 5, in one embodiment, after the polysilicon regions 150a, 150b, and 150c are formed, active gate dielectric spacers 160a1 and 160a2 are formed on side walls of the active gate electrode region 150a, whereas dummy gate dielectric spacers 160b1, 160b2, 160c1, and 160c2 are formed on side walls of the dummy gate electrode regions 150b and 150c. The gate dielectric spacers 160a1, 160a2, 160b1, 160b2, 160c1, and 160c2 (or in short, the gate dielectric spacers 160) can comprise silicon nitride.

In one embodiment, all the gate dielectric spacers 160 can be simultaneously formed by (i) forming a conformal dielectric spacer layer (not shown) on top of the structure 100 of FIG. 4, and then (ii) vertically etching back the dielectric spacer layer resulting in the dielectric spacers 160 of FIG. 5. This vertical etching may over-etch the gate dielectric layer 140 (FIG. 4) resulting in active gate dielectric region 140a and dummy gate dielectric regions 140b and 140c (FIG. 5) beneath the active gate electrode region 150a and the dummy gate electrode regions 150b and 150c, respectively. In general, there can be any numbers of active and dummy gate dielectric spacers. In one embodiment, the pattern density of all the active and dummy gate dielectric spacers of the structure 100 is essentially uniform across the structure 100. As will be clear later, the gate dielectric spacers 160a1 and 160a2 are active because they are parts of an active transistor of the complete semiconductor structure/circuit 100.

Figure 6:
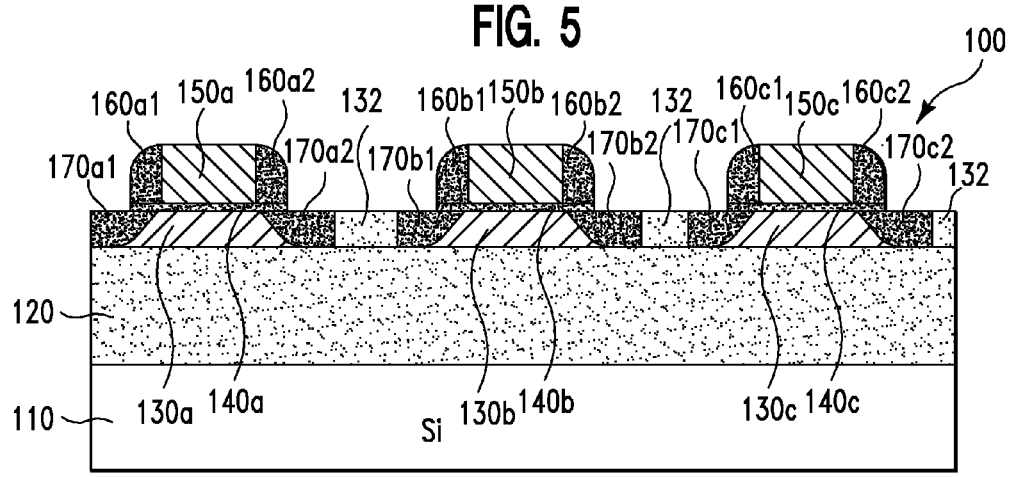
FIG. 6 shows source/drains regions formed on the structure of FIG. 5, in accordance with embodiments of the present invention.

Next, with reference to FIG. 6, in one embodiment, active source/drain regions 170a1 and 170a2 are formed in the active silicon region 130a. More specifically, the active source/drain regions 170a1 and 170a2 can be formed by implanting dopants (e.g., boron atoms if a p-channel device is to be formed) in the active silicon region 130a using an ion implantation process with the active gate electrode region 150a and the active spacer regions 160a1 and 160a2 serving as blocking masks.

It should be noted that as a by-product of the implantation process that forms the active source/drain regions 170a1 and 170a2, dummy source/drain regions 170b1, 170b2, 170c1, and 170c2 are also formed in the dummy Si regions 130b and 130c, respectively.

Figure 7:
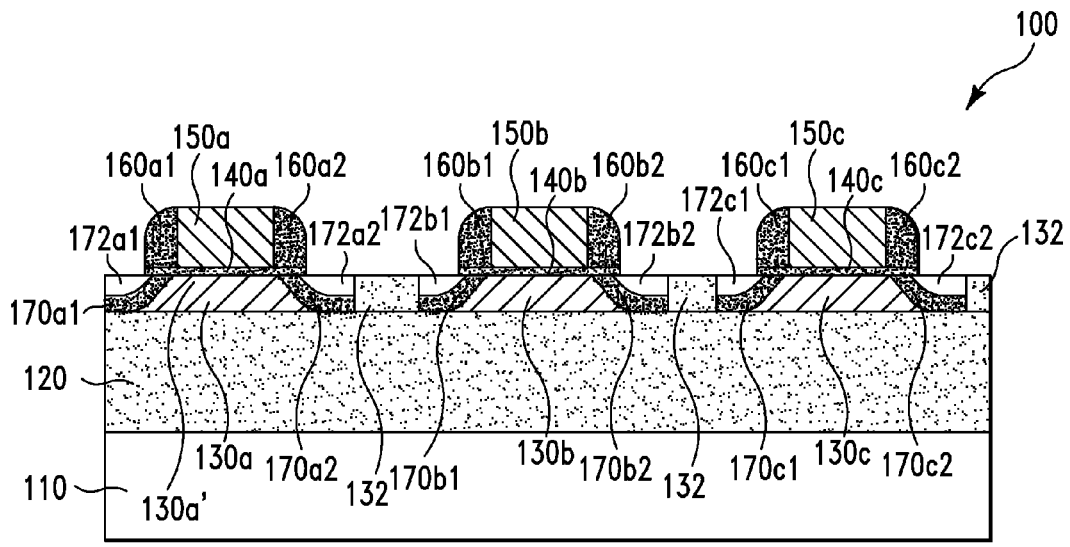
FIG. 7 shows silicide regions formed on the source/drains regions of FIG. 6, in accordance with embodiments of the present invention.
Figure 8:
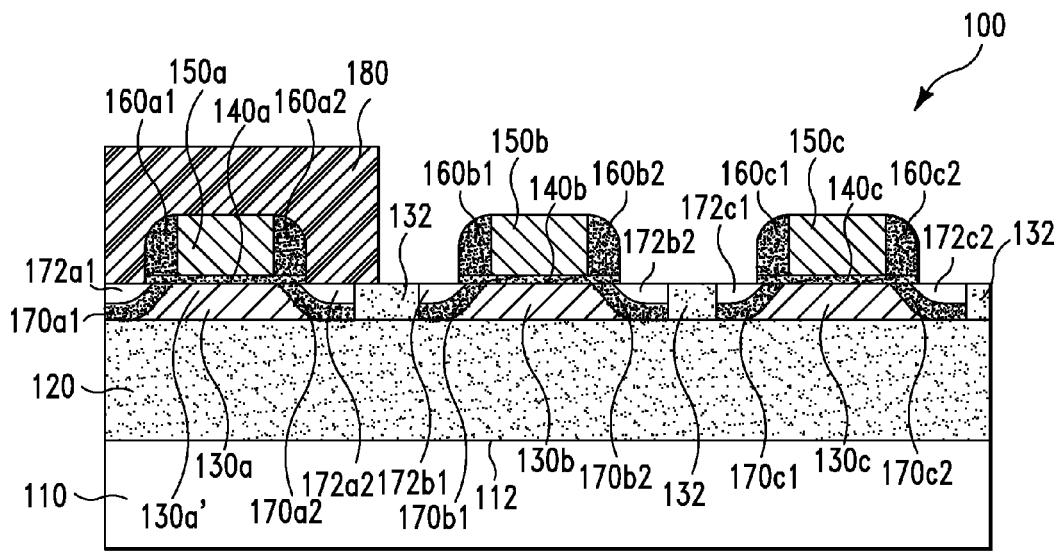
FIG. 8 shows a protection layer formed on the structure of FIG. 7, in accordance with embodiments of the present invention.

Next, with reference to FIG. 7, in one embodiment, active silicide regions 172a1 and 172a2 are formed on and in direct physical contact with the active source/drain regions 170a1 and 170a2, respectively. The active silicide regions 172a1 and 172a2 can comprise silicide nickel or another metal silicide such as cobalt silicide or titanium silicide. The active silicide regions 172a1 and 172a2 can be formed by a conventional process. For example, the active silicide regions 172a1 and 172a2 can be formed by (i) depositing a conformal nickel layer (not shown) on top of the structure 100 of FIG. 6, then (ii) heating the structure 100 resulting in nickel of the conformal nickel layer chemically reacting with silicon of the active source/drain regions 170a1 and 170a2, resulting in the active silicide nickel regions 172a1 and 172a2, and then (iii) removing the unreacted nickel, resulting in the structure 100 of FIG. 7.

It should be noted that as a by-product of the silicidation process that forms the active silicide regions 172a1 and 172a2, dummy silicide regions 172b1, 172b2, 172c1, and 172c2 are also formed as shown in FIG. 7. In an alternative embodiment, the dummy silicide regions 172b1, 172b2, 172c1, and 172c2 are not created as a result of the formation of the active silicide regions 172a1 and 172a2. More specifically, in this alternative embodiment, first, a conformal silicon nitride layer (not shown) is formed on top of the structure 100 of FIG. 6 by illustratively CVD. Next, portions of the conformal silicon nitride layer above the active regions (i.e., the active gate electrode region 150a, the active gate dielectric spacers 160a1 and 160a2, and the active silicon region 130a) are removed. Next, the active silicide regions 172a1 and 172a2 are formed as described above (i.e., as described in the main embodiment). It should be noted that in this alternative embodiment, because of the silicon nitride layer, the dummy Si regions 130b and 130c are not exposed to the silicidation process that forms the active silicide regions 172a1 and 172a2. As a result, the dummy silicide regions 172b1, 172b2, 172c1, and 172c2 (FIG. 7) are not created in this alternative embodiment. Next, after the active silicide regions 172a1 and 172a2 are formed, the silicon nitride layer is removed resulting in the structure 100 of FIG. 7 (without the dummy silicide regions 172b1, 172b2, 172c1, and 172c2).

With reference to FIG. 7, it should be noted that an active transistor (an active device) has just been formed having a channel region 130a' in the active silicon region 130a. The channel region 130a' is disposed between the active source/drain regions 170a1 and 170a2. The active transistor further comprises the active gate electrode region 150a and the active gate dielectric region 140a which electrically insulates the gate electrode region 150a from the channel region 130a'. The active transistor further comprises gate dielectric spacers 160a1 and 160a2. Hereafter the transistor can be referred to as the transistor 130a'+140a+150a.

Next, after the silicide regions 172a1 and 172a2 are formed (and after the silicon nitride layer is removed if the alternative embodiment described above is applicable), with reference to FIG. 8, in one embodiment, a patterned protection layer 180 (comprising a photoresist material for example) is formed on the structure 100 of FIG. 7 such that the active transistor 130a'+140a+150a are covered by the patterned photoresist layer 180 whereas other areas of the structure 100 having no active devices are not covered by the patterned photoresist layer 180. In one embodiment, the patterned photoresist layer 180 can be formed by a spin-on process followed by a lithographic process.

Next, the STI regions 132 and then the BOX layer 120 are etched vertically with the patterned photoresist layer 180 and the dummy regions (i.e., the dummy gate electrode regions 150b and 150c, the dummy gate dielectric spacers 160b1, 160b2, 160c1, and 160c2, the dummy silicide regions 172b1, 172b2, 172c1, and 172c2, and the dummy Si regions 130b and 130c) as blocking masks.

Figure 9:
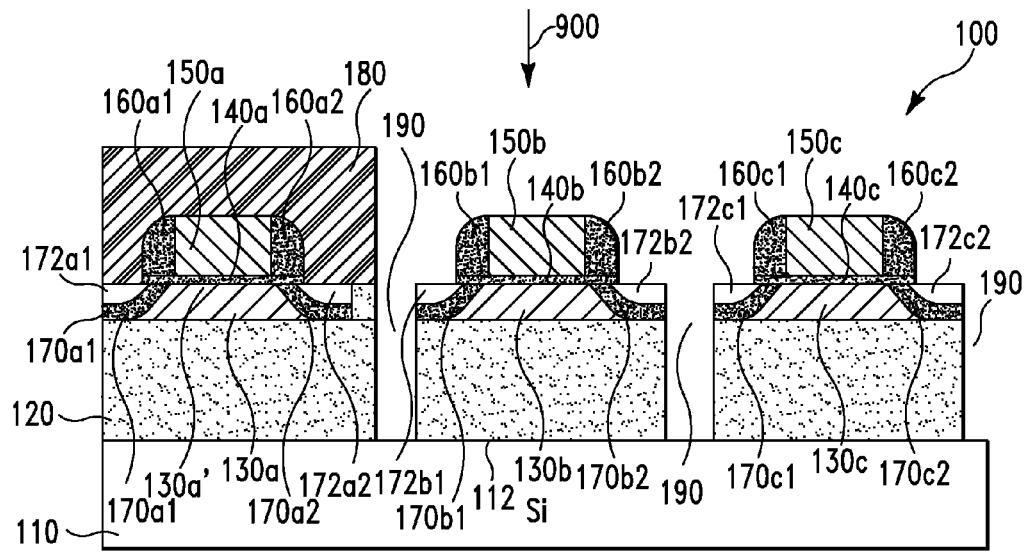
FIG. 9 shows a trench formed in the structure of FIG. 8, in accordance with embodiments of the present invention.

Also, in one embodiment, the etching of the STI region 132 and the BOX layer 120 is stopped at the top surface 112 of the bottom silicon layer 110 (as shown in FIG. 9) resulting in a trench 190 in the STI region 132 and the BOX layer 120. As a result, some areas of the top surface 112 of the bottom silicon layer 110 are exposed to the surrounding ambient through the trench 190. Also as a result, the side walls of the trench 190 are aligned with the patterned photoresist layer 180 and the dummy regions. It should be noted that in the alternative embodiment described above (in which the dummy silicide regions 172b1, 172b2, 172c1, and 172c2 of FIG. 7 are not created), the formation of the trench 190 (FIG. 9) does not expose any silicide metal material to the surrounding ambient. This is not the case in the main embodiment, because the formation of the trench 190 exposes the dummy silicide metal regions 172b1, 172b2, 172c1, and 172c2 to the surrounding ambient as shown in FIG. 9.

Next, with reference to FIG. 9, in one embodiment, the areas of the top surface 112 that are exposed to the surrounding ambient through the trench 190 are bombarded with ions such as argon (Ar) ions, helium (He) ions, neon (Ne) ions, xenon (Xe) ions, nitrogen (N) ions, germanium (Ge) ions, and carbon (C) ions resulting in damage in these areas of the top surface 112. More specifically, the bombardment of these areas of the top surface 112 (represented by arrow 900 which indicates the direction of bombardment) can be performed using an ion implantation process. In one embodiment, the direction 900 is perpendicular to the top surface 112 of the bottom Si layer 110. It should be noted that the transistor 130a'+140a+150a is not affected (i.e., is not hit by any ion) by the bombardment 900 because of the protection of the patterned photoresist layer 180.

Next, in one embodiment, the patterned photoresist layer 180 is removed, for example, by a wet etching process.

Figure 10:
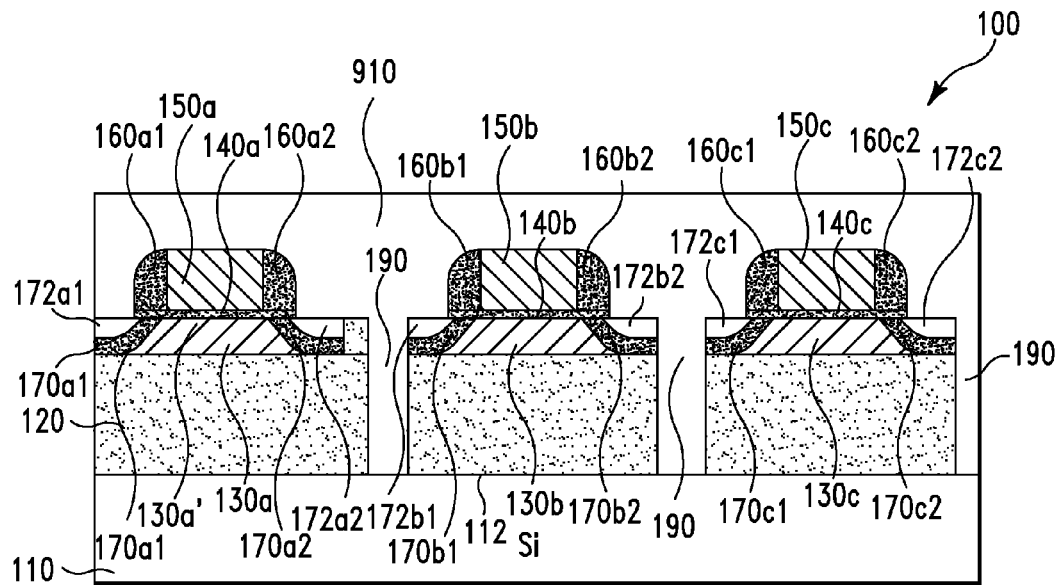
FIG. 10 shows a passivation layer formed on the structure of FIG. 9, in accordance with embodiments of the present invention.

Next, with reference to FIG. 10, in one embodiment, a dielectric material (such as BPSG—boron-phosphorous silicate glass) is deposited on the structure 100 of FIG. 9, followed by a CMP process, resulting in a BPSG passivation layer 910 of the structure 100 of FIG. 10. More specifically, in one embodiment, the BPSG deposition can be performed such that the trench 190 is completely filled by the BPSG layer 910.

Next, in one embodiment, other conventional steps are performed so as to provide electric paths to the transistor 130a'+140a+150a and so as to interconnect the transistor 130a'+140a+150a and other devices (not shown) of the structure 100. For example, electric paths to the transistor 130a'+140a+150a can be created as follows. First, holes (not shown) can be created in the BPSG layer 910 such that the silicide regions 172a and 172b are exposed to the surrounding ambient through the created holes in the BPSG layer 910. Next, the holes can be filled with an electrically conductive material (e.g., tungsten) resulting in contact regions in the holes. These contact regions provide electric paths to the source/drain regions 170a and 170b of the active transistor 130a'+140a+150a (through the silicide regions 172a and 172b, respectively).

In one embodiment, no contact region is formed in the BPSG layer 910 to provide electric paths to the dummy source/drain regions 170b1, 170b2, 170c1, and 170c2.

In summary, the fabrication process of the present invention is carried out as follows. First, active devices (like the active transistor 130a'+140a+150a of FIG. 7) and dummy regions (like the dummy regions 130b, 130c, 150b, 150c, 160b1, 160b2, 160c1, and 160c2, etc.) are formed on the SOI substrate 110+120+130 (FIG. 7). Next, the patterned photoresist layer 180 (FIG. 8) is formed so as to cover and protect the active devices (but not cover the dummy regions). Next, the STI region 132 and the BOX layer 120 are etched with the patterned photoresist layer 180 and the dummy regions serving as blocking masks resulting in some areas of the top surface 112 of the bottom Si layer 110 being exposed to the surrounding ambient. Next, the exposed areas of the top surface 112 of the bottom Si layer 110 are bombarded with heavy ions (such as Ar ions) resulting damages/defects to the top surface 112 (FIG. 9). It should be noted that the active devices are not affected by this bombardment because of the protection by the patterned photoresist layer 180. Next, the patterned photoresist layer 180 is removed, and then the dielectric layer 910 are formed, and then electrical paths to the active devices are created in the dielectric layer 910 (FIG. 10).

As a result of the damages to the top surface 112 of the bottom Si layer 110 caused by the bombardment 900 (FIG. 9) and also as a result of the presence of Ar atoms at the top surface 112, the detrimental effects to the operation of the active devices (like the transistor 130a'+140a+150a) caused by free mobile carriers near the surface 112 of the bottom Si layer 110 are mitigated.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A fabrication method, comprising:
providing a structure which includes a semiconductor substrate which includes a top substrate surface, a buried dielectric layer on the top substrate surface, a plurality of active semiconductor regions on the buried dielectric layer, a plurality of active devices on the plurality of active semiconductor regions, a plurality of dummy regions on the buried dielectric layer, and a protection layer on the plurality of active devices and the plurality of active semiconductor regions, but not on the plurality of dummy regions, wherein the plurality of active semiconductor regions comprise a first material, wherein the plurality of dummy regions comprise first dummy regions which comprise the first material, and wherein a first pattern density of the plurality of active semiconductor regions and the first dummy regions is essentially uniform across the structure;
after said providing is performed, etching the buried dielectric layer with the protection layer and the plurality of dummy regions as blocking masks, resulting in a trench in the buried dielectric layer such that side walls of the trench are aligned with the plurality of dummy regions, and such that some areas of the top substrate surface are exposed to a surrounding ambient through the trench; and after said etching is performed, bombarding the exposed areas of the top substrate surface with bombardment ions such that said bombarding does not bombard the plurality of active devices with any ion.

2. The method of claim 1, further comprising, after said bombarding is performed:

removing the protection layer; and after said removing is performed, forming a dielectric passivation layer on the structure such that the trench is completely filled by the dielectric passivation layer.

3. The method of claim 2, further comprising, after said forming the dielectric passivation layer is performed, forming contact regions in the dielectric passivation layer, wherein the contact regions provide electric paths to the plurality of active devices.

4. The method of claim 1, wherein the bombardment ions are of an element selected from the group consisting of Ar, He, Ne, Xe, N, Ge, and C, and where the plurality of active devices comprise active transistors.

5. The method of claim 1, wherein the first material comprises silicon, and wherein no silicide metal material is exposed to the surrounding ambient via the trench.

6. The method of claim 5, wherein the plurality of active devices comprise first active regions, wherein the plurality of dummy regions further comprise second dummy regions, wherein both the first active regions and the second dummy regions comprise a second material different than the first material, and wherein a second pattern density of the first active regions and the second dummy regions is approximately uniform across the structure.

7. The method of claim 6, wherein the first active regions comprise active gate electrode regions, and wherein the active gate electrode regions are electrically insulated from the plurality of active semiconductor regions.

8. The method of claim 7, wherein the second material comprises polysilicon.

9. The method of claim 8, wherein the plurality of active devices further comprise second active regions, wherein the plurality of dummy regions further comprise third dummy regions, and wherein a third pattern density of the second active regions and the third dummy regions is approximately uniform across the structure.

10. The method of claim 9, wherein the third dummy regions are on side walls of the second dummy regions.

11. A structure, comprising:

a semiconductor substrate which includes a top substrate surface, a buried dielectric layer on the top substrate surface, a plurality of active semiconductor regions on the buried dielectric layer, a plurality of active devices on the plurality of active semiconductor regions, a plurality of dummy regions on the buried dielectric layer, and a protection layer on the plurality of active devices and the plurality of active semiconductor regions, but not on the plurality of dummy regions, wherein the plurality of active semiconductor regions comprise a first material, wherein the plurality of dummy regions comprise first dummy regions which comprise the first material, and wherein a first pattern density of the plurality of active semiconductor regions and the first dummy regions is essentially uniform across the structure; and a trench in the buried dielectric layer such that side walls of the trench are aligned with the plurality of dummy regions, and such that some areas of the top substrate surface are exposed to a surrounding ambient through the trench.

12. The structure of claim 11, further comprising implanted ions of an element in the buried dielectric layer and at said some areas of the top substrate surface, wherein there is no ion of said element in the buried dielectric layer and at other areas of the top substrate surface.

13. The structure of claim 11, wherein the first material comprises silicon, and wherein no silicide metal material is exposed to the surrounding ambient via the trench.

14. The structure of claim 13, wherein the plurality of active devices comprise first active regions, wherein the plurality of dummy regions further comprise second dummy regions, wherein both the first active regions and the second dummy regions comprise a second material different than the first material, and wherein a second pattern density of the first active regions and the second dummy regions is approximately uniform across the structure.

15. A structure, comprising:

a semiconductor substrate which includes a top substrate surface, a buried dielectric layer on the top substrate surface, a plurality of active semiconductor regions on the buried dielectric layer, a plurality of active devices on the plurality of active semiconductor regions;

a plurality of dummy regions on the buried dielectric layer; and a trench in the buried dielectric layer such that side walls of the trench are aligned with the plurality of dummy regions, and such that some areas of the top substrate surface are exposed to a surrounding ambient through the trench.

16. The structure of claim 15, wherein the surrounding ambient surrounds and is in direct physical contact with the plurality of dummy regions.

17. The structure of claim 15, wherein the top substrate surface, a bottom surface of the buried dielectric layer, and a bottom bounding surface of the trench are coplanar, and wherein the bottom bounding surface of the trench is in direct physical contact with the top substrate surface.

18. The structure of claim 15, wherein each dummy region comprises silicon.

19. The structure of claim 15, wherein each dummy region comprises silicon implanted with dopant.

20. The structure of claim 15, wherein each dummy region comprises a first dummy silicon subregion that includes silicon, a second dummy silicon subregion that includes silicon implanted with dopant, and a dummy silicide subregion that includes silicide, wherein a first portion of the second dummy silicon subregion is in direct physical contact with, and is disposed between, the dummy silicide subregion and the top substrate surface, and wherein a second portion of the second dummy silicon subregion is in direct physical contact with, and is disposed between, the dummy silicide subregion and the first dummy silicon subregion.

* * * * *